United States Patent
Kim et al.

(10) Patent No.: US 11,348,963 B2
(45) Date of Patent: May 31, 2022

(54) DIGITAL X-RAY DETECTOR AND THIN-FILM TRANSISTOR ARRAY SUBSTRATE FOR THE SAME

(71) Applicant: LG Display Co., Ltd., Seoul (KR)

(72) Inventors: Jungjune Kim, Seoul (KR); Youngjin Yi, Seoul (KR); Younghun Han, Bucheon-si (KR); Youngyoung Chang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 224 days.

(21) Appl. No.: 16/666,265

(22) Filed: Oct. 28, 2019

(65) Prior Publication Data
US 2020/0135796 A1    Apr. 30, 2020

(30) Foreign Application Priority Data
Oct. 31, 2018  (KR) .................. 10-2018-0132421

(51) Int. Cl.
*G01T 1/24*     (2006.01)
*H01L 27/146*   (2006.01)
*G01T 1/20*     (2006.01)

(52) U.S. Cl.
CPC .... *H01L 27/14658* (2013.01); *G01T 1/20183* (2020.05); *H01L 27/14603* (2013.01); *H01L 27/14612* (2013.01)

(58) Field of Classification Search
CPC ................. G01T 1/2018; G01T 1/20183
See application file for complete search history.

(56) References Cited

U.S. PATENT DOCUMENTS

| | | | |
|---|---|---|---|
| 2008/0203311 A1* | 8/2008 | Watanabe | H01L 27/14658 250/370.08 |
| 2020/0003911 A1* | 1/2020 | Nara | G01T 1/2002 |

* cited by examiner

*Primary Examiner* — David P Porta
*Assistant Examiner* — Shun Lee
(74) *Attorney, Agent, or Firm* — Seed IP Law Group LLP

(57) ABSTRACT

The present disclosure relates to a digital X-ray detector and a thin-film transistor array substrate for the same. Disclosed is a thin-film transistor array substrate for a digital X-ray detector in which deterioration of electrical characteristics of a thin-film transistors made of an oxide semiconductor may be reduced or minimized and aging of a PIN diode caused by external moisture may be reduced or minimized. Further, disclosed is a digital X-ray detector including the array substrate. To this end, the array substrate includes a second protective layer having a variety of patterns so as to cover at least a portion of the PIN diode but not to cover the thin-film transistor. The second protective layer includes $SiN_x$. Thus, a de-hydrogenation path from the thin-film transistor may be secured and an external moisture barrier effect for the PIN diode may be achieved.

16 Claims, 8 Drawing Sheets

DIGITAL X-RAY DETECTOR AND THIN-FILM TRANSISTOR ARRAY SUBSTRATE FOR THE SAME

CROSS-REFERENCE TO RELATED APPLICATIONS

This application claims the priority of Korean Patent Application No. 10-2018-0132421 filed on 31 Oct. 2018 in the Korean Intellectual Property Office, the disclosure of which is hereby incorporated by reference in its entirety.

BACKGROUND

Technical Field

The present disclosure relates to a thin-film transistor array substrate for a digital X-ray detector.

Description of the Related Art

Because X-ray is of a short wavelength, the X-ray can transmit an object easily. The transmittance of an X-ray depends on an inner density of the object. Therefore, an internal structure of the object may be observed by detecting the transmittance of the X-ray as transmitted through the object.

One of X-ray based inspection methods used in a medical field is a film printing scheme. However, in the film printing scheme, in order to check a result, an image is shot, and then a film is printed. Thus, it takes a long time to check the result. Especially, in the film printing scheme, there are many difficulties in storing and preserving the printed film.

Recently, a digital X-ray detector (DXD) using a thin-film transistor has been developed and widely used in the medical field.

The digital X-ray detector detects the transmittance of the X-ray transmitted through the object and displays an internal state of the object on a display based on the transmittance. Therefore, the digital X-ray detector may display the internal structure of the object without using a separate film and a printed paper. Further, the DXD has an advantage that the result may be checked in real time immediately after X-ray photographing.

BRIEF SUMMARY

The thin-film transistor array substrate according to the present disclosure including a PIN diode has reduced or minimized aging effect due to moisture. In addition, a thin-film transistor having high uniformity of electrical characteristics is provided to a digital X-ray detector including the thin-film transistors. That is, the present disclosure provides a thin-film transistor array substrate for a digital X-ray detector that may reduce or minimize deterioration of electrical characteristics of a thin-film transistor made of an oxide semiconductor and provides a digital X-ray detector including the thin-film transistor array substrate.

Further, the present disclosure provides a thin-film transistor array substrate for a digital X-ray detector that may reduce or minimize aging of a PIN diode due to external moisture and to provide a digital X-ray detector including the thin-film transistor array substrate.

Furthermore, the present disclosure provides a thin-film transistor array substrate for a digital X-ray detector which may reduce or minimize incidence of light onto a side surface of a PIN diode and to provide a digital X-ray detector including the thin-film transistor array substrate.

The present disclosure is not limited to the above-mentioned advantages. Other advantages of the present disclosure, as not mentioned above, may be understood from the following descriptions and more clearly understood from the embodiments of the present disclosure. Further, it will be readily appreciated that the advantages of the present disclosure may be realized by features and combinations thereof as disclosed in the claims.

In one aspect of the present disclosure, there is proposed a thin-film transistor array substrate for a digital X-ray detector, the thin-film transistor array substrate including a thin-film transistor, a first protective layer on the thin-film transistor, a PIN diode on the first protective layer, a second protective layer covering at least a portion of the PIN diode and not covering the thin-film transistor, and a third protective layer covering both the thin-film transistor and the PIN diode. Further, in another aspect of the present disclosure, there is proposed a digital X-ray detector including the above-defined thin-film transistor array substrate.

In this connection, the second protective layer may cover an edge region of the PIN diode. Alternatively, the second protective layer may cover an entire surface of the PIN diode. Alternatively, the second protective layer may cover an entire surface of the base substrate except for a region of the base substrate at which the thin-film transistor is disposed. Alternatively, the second protective layer may additionally cover a gate electrode of the thin-film transistor. Alternatively, the second protective layer may cover additionally cover one of a first contact hole and a second contact hole of the thin-film transistor.

Further, the second protective layer may include $SiN_x$. In this case, each of the first protective layer, an inter-layer insulating layer disposed between an active layer and a first electrode and a second electrode, and the third protective layer may include either $SiO_2$ or SiON.

Further, the first protective layer may include $SiN_x$. In this case, at least one of the first contact hole and the second contact hole may not be covered with $SiN_x$.

According to the present disclosure, a dehydrogenation path from the thin-film transistor made of an oxide semiconductor can be secured to improve a negative shift phenomenon of the thin-film transistor such that deterioration of an electrical characteristic thereof can be reduced or minimized.

Further, according to the present disclosure, even when a thickness of a moisture barrier film for the PIN diode is increased or maximized, this does not inhibit the formation of the dehydrogenation path. Thus, reliability of the PIN diode can be improved by reducing or minimizing the aging of the PIN diode due to the external moisture.

Moreover, according to the present disclosure, the protective layers with different refractive indexes may be formed on the PIN diode. This may reduce or minimize direct incidence of light on the side surface of the PIN diode, thereby further improving the reliability of the PIN diode.

Another aspect of the present disclosure provides a digital X-ray detector. The digital X-ray detector includes a thin-film transistor array substrate.

The thin-film transistor array substrate includes a base substrate, a plurality of thin-film transistors on the base substrate, a first protective layer on the plurality of thin-film transistors, a PIN diode on the first protective layer, a second protective layer on a portion of the PIN diode.

In one embodiment, each thin-film transistor includes an active layer, a gate electrode, a first electrode, and a second electrode. The first and second electrodes are connected to the active layer.

In one embodiment, the PIN diode includes a lower electrode connected to the thin-film transistor, a PIN layer on the lower electrode, and an upper electrode on the PIN layer.

In one embodiment, the second protective layer exposes a space of the PIN diode.

The thin-film transistor array substrate further includes a bias electrode on the PIN diode and connected to the upper electrode, and a third protective layer on the bias electrode.

In one embodiment, the third protective layer extends over the thin-film transistor and the PIN diode.

The digital X-ray detector further includes a scintillator layer disposed on the thin-film transistor array substrate.

In one embodiment, the second protective layer is spaced apart from the thin-film transistor.

In one embodiment, the bias electrode covers the space exposed by the second protective layer.

The digital X-ray detector further includes a planarization layer between the third protective layer and the second protective layer.

In one embodiment, the planarization layer is between the bias electrode and the second protective layer.

In addition to the above embodiments and its related effects, further specific effects of the present disclosure are described below in conjunction with descriptions of specific details to implement the present disclosure.

DETAILED DESCRIPTION

Figure 1:
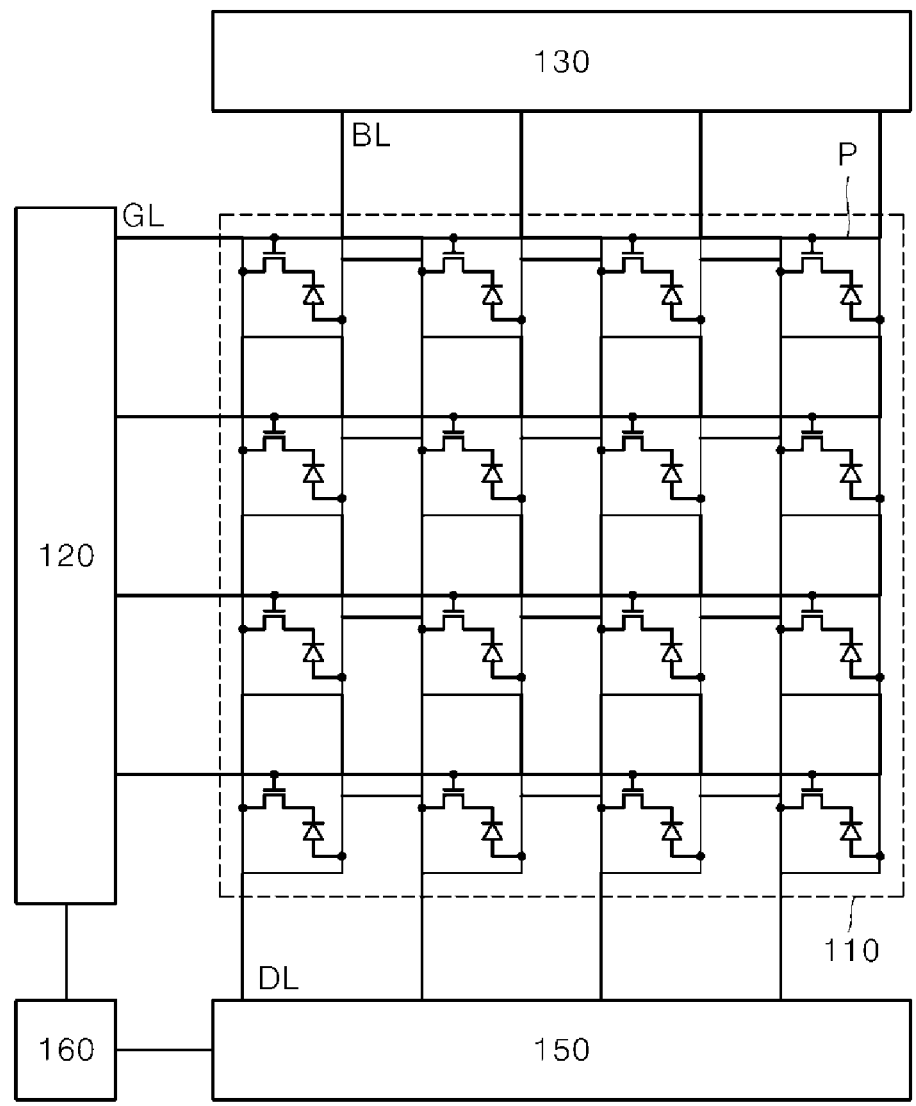
FIG. 1 is a block diagram for schematically illustrating a digital X-ray detector.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a thin-film transistor array substrate for a digital X-ray detector and a digital X-ray detector including the thin-film transistor array substrate according to some embodiments of the present disclosure are described.

FIG. 1 is a block diagram for schematically describing the digital X-ray detector. The digital X-ray detector may include a thin-film transistor array 110, a gate driver 120, a bias supply 130, a readout circuitry 150, and a timing controller 160.

The thin-film transistor array 110 includes a plurality of cell regions formed by a plurality of gate lines GL arranged in a first direction and by a plurality of data lines DL arranged in a second direction transverse to the first direction. In one embodiment, the first direction is a horizontal direction and the second direction is a vertical direction. In this embodiment, the first direction and the second direction may be orthogonal or perpendicular to each other. However, other various directions may be contemplated. The cell regions are arranged in a matrix form. In each cell region, photo-sensitive pixels Ps may be formed. The thin-film transistor array 110 detects the X-ray emitted from an X-ray source and converts the detected X-ray into an electrical signal and outputs the electrical signal.

Each photo-sensitive pixel includes a PIN diode which converts light of a visible light region converted from the X-ray by a scintillator into an electronic signal and outputs the electronic signal, and a thin-film transistor TFT which transmits a detected signal output from the PIN diode to the readout circuitry 150. One end of the PIN diode may be connected to the thin-film transistor and the other end thereof may be connected to a bias line BL.

A gate electrode of the thin-film transistor may be connected to the gate line GL which carries a scan signal. Source/drain electrodes of the thin-film transistor may be respectively connected to the PIN diode and a data line DL which carries the detected signal output from the PIN diode. Each bias line BL may extend in a parallel manner to each data line DL.

The gate driver 120 may sequentially apply gate signals to thin-film transistors of photo-sensitive pixels through the gate lines GLs. The thin-film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 150 may read out the detected signal transmitted from the thin-film transistor turned on in response to the gate signal of the gate driver 120. That is, the detected signal output from the PIN diode may be input to the readout circuitry 150 through the thin-film transistor and the data line DL.

The readout circuitry 150 may read out the detected signal output from each of the photo-sensitive pixels during an offset readout period for reading out an offset image and an X-ray readout period for reading out the detected signal after an X-ray exposure to an object.

The readout circuitry 150 may include a signal detector and a multiplexer. The signal detector includes a plurality of amplification circuits that correspond respectively to the data lines DL. Each amplification circuit may include an amplifier, a capacitor, and a reset element.

The timing controller 160 may generate an initiation signal and a clock signal and supply the initiation signal and the clock signal to the gate driver 120 to control an operation of the gate driver 120. Further, the timing controller 160 may generate a readout control signal and a readout clock signal, and may supply the readout control signal and the readout clock signal to the readout circuitry 150 to control an operation of the readout circuitry 150.

Figure 2:
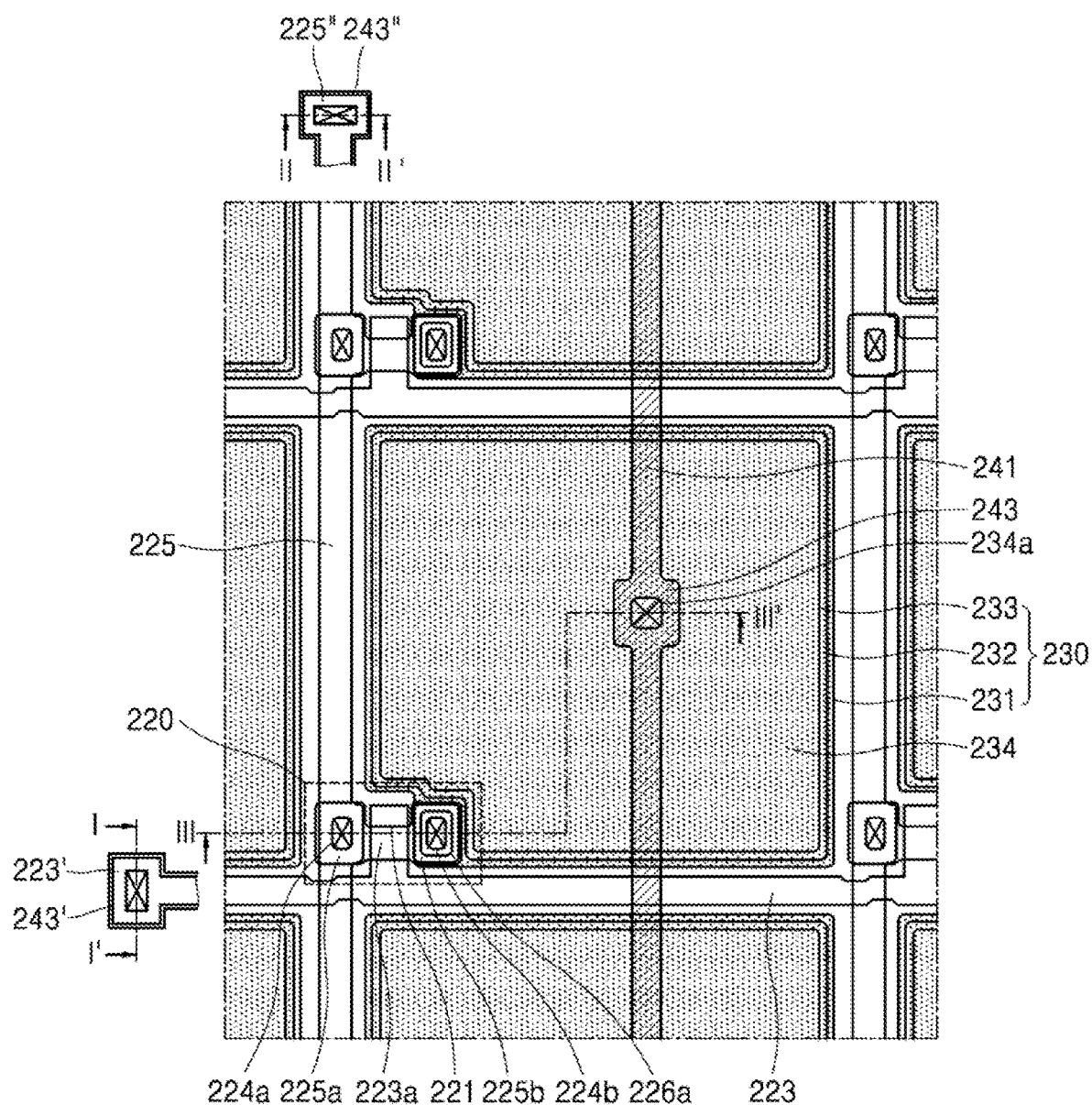
FIG. 2 is a top view of a partial region of a thin-film transistor array substrate for a digital X-ray detector according to a first embodiment of the present disclosure.
Figure 3:
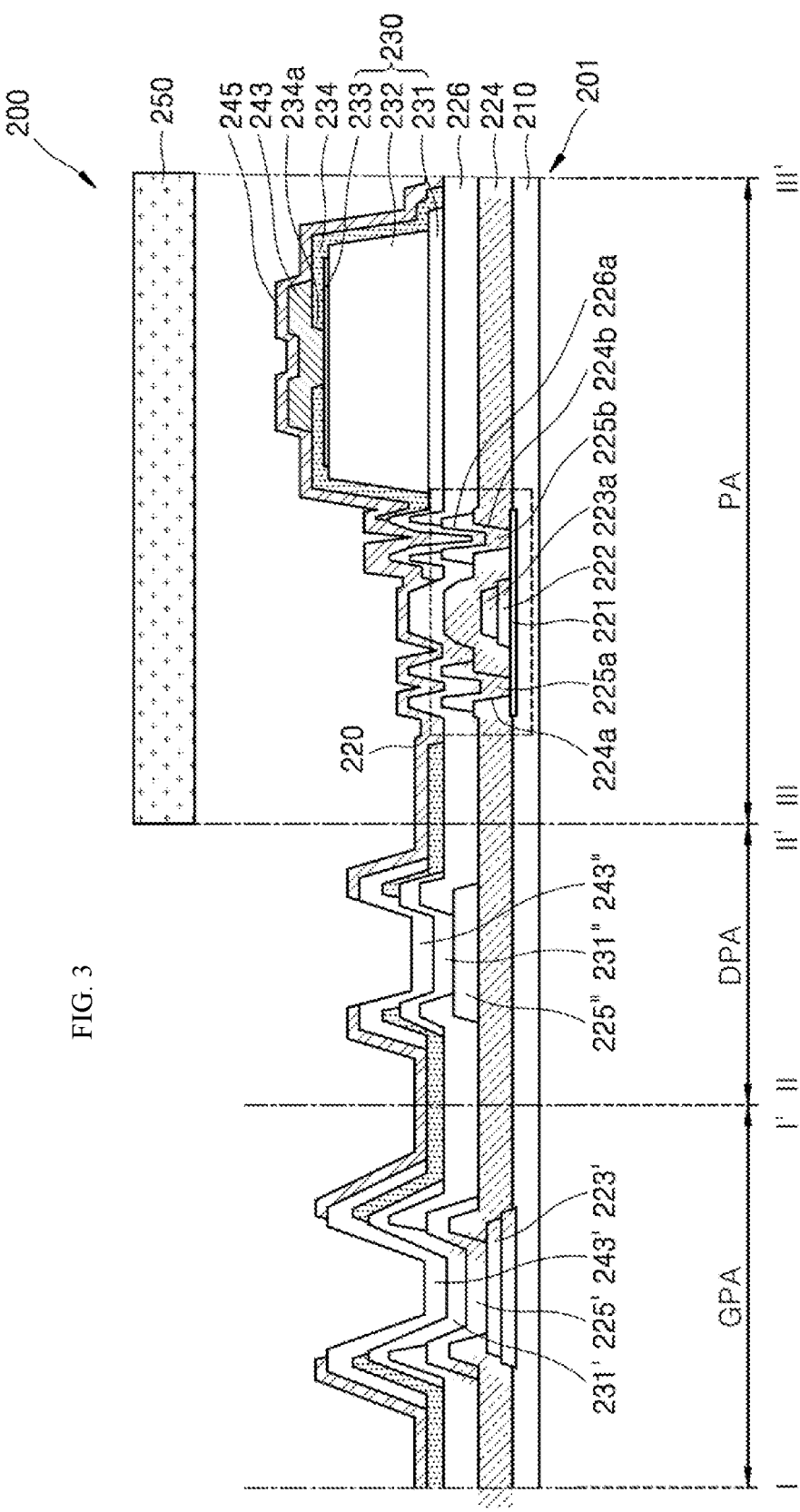
FIG. 3 is a cross-sectional view of a partial region of a thin-film transistor array substrate for a digital X-ray detector according to the first embodiment of the present disclosure.

FIG. 2 and FIG. 3 respectively show a top view and a cross-sectional view of a partial region of the TFT array substrate for the digital X-ray detector according to a first embodiment of the present disclosure. Hereinafter, a pixel area PA including the PIN diode and the thin-film transistor corresponding to one pixel, a gate pad area GPA, and a data pad area DPA will be described in detail.

The base substrate 210 may have a plurality of cell regions formed by overlapping between the gate lines 223 extending in one direction and the data lines 225 extending in another direction orthogonal to the gate lines 223. Each pixel P may correspond to each cell region. A plurality of pixels P may be formed adjacent to the overlapping locations of the gate lines 223 and the data lines 225.

Each thin-film transistor 220 and each PIN diode 230 may be disposed for each pixel. The plurality of thin-film transistors 220 and PIN diodes 230 may be formed on the array substrate 201. Hereinafter, description will be made based on each thin-film transistor 220 and each PIN diode 230 corresponding to one pixel. Unless otherwise specified, the same or similar description may be applicable to an adjacent pixel.

The thin-film transistor 220 including an active layer 221, a gate electrode 223a, and a first electrode 225a and a second electrode 225b connected to the active layer 221 may be formed on a base substrate 210.

Between the base substrate 210 and the thin-film transistor 220, there may be a buffer layer made of an inorganic material such as silicon oxide $SiO_x$.

The active layer 221 may be made of an oxide semiconductor material which may include IGZO (InGaZnO)-based materials.

The gate electrode 223a may be formed on the active layer 221. A gate insulating layer 222 may be formed between the active layer 221 and the gate electrode 223a to electrically isolate the active layer 221 from the gate electrode 223a. That is, on the gate insulating layer 222, there may be formed the gate electrode 223a extending from the gate line 223 to correspond to a channel region of the active layer 221. The gate electrode 223a may be embodied as a single layer or multiple layers of conductive material.

In one embodiment, the gate electrode 223a may extend from the gate line 223. For example, the gate line 223 and the gate electrode 223a are monolithic so that the gate line 223 may be used as the gate electrode 223a. That is, the gate line 223 and the gate electrode 223 may be formed as a single, contiguous, and continuous structure. In addition, the gate line 223 and the gate electrode 223a may define the same layer. In other embodiments, the gate electrode 223a may be formed separate from the gate line 223.

The gate insulating layer 222 may be formed to correspond to the gate electrode 223a. However, the present disclosure is not limited thereto. The gate insulating layer 222 may be formed to have the same or larger area as that of the gate electrode 223a for effective insulation.

The gate electrode 223a and the gate insulating layer 222 may be formed on a middle region of the active layer 221. Therefore, a source region and a drain region may be respectively formed as both end regions of the active layer 221 other than the channel region of the active layer 221, where the both end regions are not covered by the gate electrode 223a and are exposed.

The source region and the drain region of the active layer 221 may be respectively formed by converting the both end regions of the active layer 221 to conductive regions. The both end regions of the active layer 221 may be converted to the conductive regions via various methods such as a dry etching method, a hydrogen plasma treatment, a helium plasma treatment and the like.

The source region of the active layer 221 may be disposed closer to the PIN diode 230 than the drain region thereof. However, the present disclosure is not limited thereto. The drain region of the active layer 221 may be disposed closer to the PIN diode 230 than the source region thereof.

An inter-layer insulating layer 224 made of an inorganic material may be formed on the gate electrode 223a. On the inter-layer insulating layer 224, the first electrode 225a and the second electrode 225b may be formed.

The first electrode 225a and the second electrode 225b may be respectively formed to overlap the both end regions of the active layer 221, such that the gate electrode 223a is horizontally interposed between the first electrode 225a and the second electrode 225b. A first contact hole 224a and a second contact hole 224b may be formed in the inter-layer insulating layer 224 such that the first contact hole 224a and second contact hole 224b are vertically interposed between one end region of the active layer 221 and the first electrode 225a and between the other end region of the active layer 221 and the second electrode 225b, respectively.

Specifically, the first contact hole 224a may be formed to correspond to the drain region of the active layer 221, while the second contact hole 224b may be formed to correspond to the source region of the active layer 221. Accordingly, the first electrode 225a may be connected to the drain region of the active layer 221 via the first contact hole 224a, while the second electrode 225b may be connected to the source region of the active layer 221 via the second contact hole 224b.

The first electrode 225a and the second electrode 225b may extend from the data line 225. The first electrode 225a and the second electrode 225b and the data line 225 may be formed at the same layer. In one embodiment, the first electrode 225a may act as a drain electrode, while the second electrode 225b may act as a source electrode.

A first protective layer 226 made of an inorganic material may be formed on the thin-film transistor 220. The first protective layer 226 may serve to protect an underlying thin-film transistor 220, particularly the active layer 221.

The PIN diode 230 may be formed on the first protective layer 226. The PIN diode 230 may be disposed in a cell region. The PIN diode 230 may include a lower electrode 231 connected to the thin-film transistor 220, a PIN layer 232 on the lower electrode 231, and an upper electrode 233 on the PIN layer 232.

The lower electrode 231 may serve as a pixel electrode in the PIN diode 230. The lower electrode 231 may be made of an opaque metal such as molybdenum (Mo) or a transparent oxide such as ITO (Indium Tin Oxide), IZO (Indium Zinc Oxide) or ZnO (Zinc Oxide) depending on characteristics of the PIN diode.

The lower electrode 231 may be connected to the second electrode 225b of the thin-film transistor 220 via a third contact hole 226a in the first protective layer 226.

A PIN layer 232 may be formed on the lower electrode 231 to convert visible light converted from an X-ray via a scintillator into an electric signal. The PIN layer 232 may be formed by sequentially stacking an N (negative) type semiconductor layer including an N type impurity, a I (intrinsic type) semiconductor layer not including an impurity, and a P (positive) type semiconductor layer including a P type impurity.

The I-type semiconductor layer may be relatively thicker than the N-type semiconductor layer and the P-type semiconductor layer. The PIN layer 232 contains a material capable of converting visible light from the scintillator into an electrical signal. For example, the material capable of converting visible light from the scintillator into the electrical signal may include a-Se, $HgI_2$, CdTe, PbO, $PbI_2$, $BiI_3$, GaAs, and Ge.

The upper electrode 233 may be formed on the PIN layer 232. The upper electrode 233 may be made of at least one of transparent oxides such as ITO (Indium Tin Oxide), IZO (Indium Zinc Oxide), and ZnO (Zinc Oxide) to improve a fill factor of the PIN diode 230.

A second protective layer 234 may be formed on the PIN diode 230.

According to the present disclosure, the second protective layer 234 may be made of an inorganic material having a hydrogen diffusion distance of about $9.9 \times 10^{-3}$ nm or smaller at about 105° C. for about 1 second. Herein, an example where the inorganic material having a hydrogen diffusion distance of about $9.9 \times 10^{-3}$ nm or smaller at about 105° C. for about 1 second is silicon nitride (SiN) such as SiN will be described by way of example. However, the present disclosure is not limited thereto.

The hydrogen diffusion distance as described herein may be measured as follows.

When using $SiN_x$ as a diffusion medium and using hydrogen (H) as diffusing species diffusing in $SiN_x$, a distance of movement of the hydrogen (H) in the $SiN_x$ is measured at about 105° C. for about 1 second.

Since the PIN diode is vulnerable to external moisture, a moisture barrier film that may protect the PIN diode from the external moisture is needed. In this case, the inorganic material such as $SiN_x$ may have a good moisture blocking effect and thus may constitute the moisture barrier film.

That is, the inorganic material such as $SiN_x$ having a small hydrogen diffusion distance may have excellent moisture blocking performance and thus may be used for the moisture barrier film. However, since the inorganic material such as $SiN_x$ has the small hydrogen diffusion distance, the hydrogen may not be discharged out when there is an element such as the thin-film transistor under the second protective layer. Hereinafter, this will be further addressed.

Various elements such as the thin-film transistor, PIN diode and various protective layers are formed on the base substrate usually using a depositing technique. In this case, a large amount of hydrogens (H) may be generated from each deposition process.

When the generated hydrogen remains in the thin-film transistor, particularly, the active layer made of an oxide semiconductor material, a negative shift phenomenon in the thin-film transistor may be induced to cause deterioration of electrical characteristics thereof.

Therefore, in order to reduce or minimize the deterioration of the electrical characteristics of the thin-film transistor, the excessive hydrogen in the active layer may be discharged out via a dehydrogenation process in which the thin-film transistor is generally heat-treated.

Since, as described above, $SiN_x$ has an excellent moisture blocking effect and thus is used for the moisture barrier film, the elements underneath $SiN_x$ may be minimally affected by external moisture when $SiN_x$ covers an entire surface of the base substrate including the PIN diode region.

However, when, in order to increase or maximize the effect of the moisture barrier film, $SiN_x$ covers the entire surface of the base substrate, the external moisture barrier effect may be excellent, but a path through which hydrogen in the active layer may escape may be blocked.

This is because $SiN_x$ is an inorganic substance with a small hydrogen diffusion distance, and thus it is very difficult for hydrogen discharged from a bottom of the second protective layer to pass through the second protective layer made of $SiN_x$ and then to be discharged out.

In particular, the moisture barrier effect of $SiN_x$ is proportional to the thickness of $SiN_x$. Thus, when the thickness of the $SiN_x$ is increased, the external moisture barrier effect for the PIN diode is increased, but the hydrogen discharge-out from the underlying active layer becomes more difficult.

In one example, when the second protective layer is composed of an inorganic material such as silicon oxide $SiO_x$ such as $SiO_2$ or SiON having a large hydrogen diffusion distance in which the hydrogen diffusion distance of about $9.9 \times 10^{-3}$ nm or larger for about 1 second at about 105° C. is achieved, the hydrogen discharge-out from the underlying active layer may be facilitated.

However, when the second protective layer is made of the inorganic material such as $SiO_2$ or SiON, it is difficult to effectively prevent the external moisture from penetrating the PIN diode, thereby causing the PIN diode element to be vulnerable to aging due to the external moisture.

Thus, the second protective layer may be preferably configured to effectively protect the PIN diode from the external moisture while effectively discharging out the hydrogen from the active layer of the thin-film transistor.

Accordingly, the second protective layer according to the present disclosure may be made of an inorganic material such as $SiN_x$ having a hydrogen diffusion distance of about $9.9 \times 10^{-3}$ nm or smaller for about 1 second at about 105° C. and, at the same time, may have various patterns configured to protect the PIN diode from the external moisture.

Specifically, the second protective layer 234 according to the present disclosure may have a pattern configured to cover at least a portion of the PIN diode 230, but not to cover the thin-film transistor 220.

As used herein, the feature that the second protective layer 234 covers at least the portion of the PIN diode 230 may be formed to include both of a feature that the second protective layer 234 covers the entire surface of the PIN diode 230 and a feature that the second protective layer 234 covers a partial region such as an edge region of the PIN diode 230.

Further, the feature that the second protective layer 234 covers the entire surface of the PIN diode 230 may not be limited to a configuration that an opening region is not present in the second protective layer 234. However, the feature that the second protective layer 234 covers the entire surface of the PIN diode 230 may include a configuration that an opening region may be formed in a contact hole region for connection between electrodes with the second protective layer 234 interposed therebetween.

Further, the feature that the second protective layer 234 does not cover the thin-film transistor 220 may include a configuration that the second protective layer 234 and the thin-film transistor 220 do not overlap each other at all, a configuration that the second protective layer 234 overlaps with a partial region such as the gate electrode 223a region, or a configuration that the second protective layer 234 overlaps with a partial region of the active layer 221 corresponding to the first contact hole 224a or the second contact hole 224b.

Various embodiments of the pattern of the second protective layer 234 according to the present disclosure are as follows. In describing each embodiment of the pattern, contents overlapping with those in the above-described embodiment may be omitted. The omitted contents may be equally applied to embodiments as described below.

In a first embodiment, the second protective layer 234 may be formed to cover the entire surface of the PIN diode 230, as shown in FIG. 2. The second protective layer 234 may be formed to cover a side surface and a top surface of the PIN diode 230 to act as the moisture barrier film that reduces or minimizes penetration of the external moisture into the PIN diode 230.

The thin-film transistor array substrate 201 for a digital X-ray detector according to the present disclosure includes a plurality of pixel regions. The thin-film transistor array substrate 201 includes the plurality of PIN diodes 230, each PIN diode corresponding to each pixel region.

The second protective layer 234 according to the first embodiment may be patterned to cover each of the plurality of PIN diodes 230 such that the second protective layer 234 covering a corresponding PIN diode 230 is not connected to a second protective layer 234 covering a PIN diode 230 adjacent to the corresponding PIN diode 230.

That is, the second protective layer 234 may be patterned to cover the entire surface of the PIN diode 230 in a conformal manner, but not to cover the thin-film transistor 220 and not to cover the gate line 223 and the data line 225.

The configuration that the second protective layer 234 is patterned to cover the entire surface of the PIN diode 230 in a conformal manner may not be limited to a configuration that no opening region is present in the second protective layer 234 on the PIN diode 230.

Specifically, the second protective layer 234 may not be present in a third contact hole 226a region for connection between the upper electrode 233 and the bias electrode 243 with the second protective layer 234 interposed therebetween.

Thus, when the second protective layer 234 is formed on the entire surface of the PIN diode 230 in a conformal manner thereto, the second protective layer 234 can effectively protect the PIN diode 230 from the external moisture.

In addition, since the second protective layer 234 is formed so as not to cover the thin-film transistor 220, specifically, the active layer 221, a path along which the hydrogen is discharged out from the active layer 221 may be secured. Thus, the deterioration of the electrical characteristic of the thin-film transistor element may be reduced or minimized.

In particular, although the thickness of the second protective layer 234 is increased or maximized, this may not inhibit a formation of the dehydrogenation path from the active layer 221. Thus, the second protective layer 234 may be formed as thick as possible, thereby to reduce or minimize the aging of the PIN diode 230 due to external moisture, thereby further improving the reliability of the PIN diode.

Accordingly, the second protective layer 234 may be formed to have a thickness of about 500 Å or greater, thereby increasing or maximizing the moisture blocking effect for the PIN diode while securing the dehydrogenation path.

Figure 5:
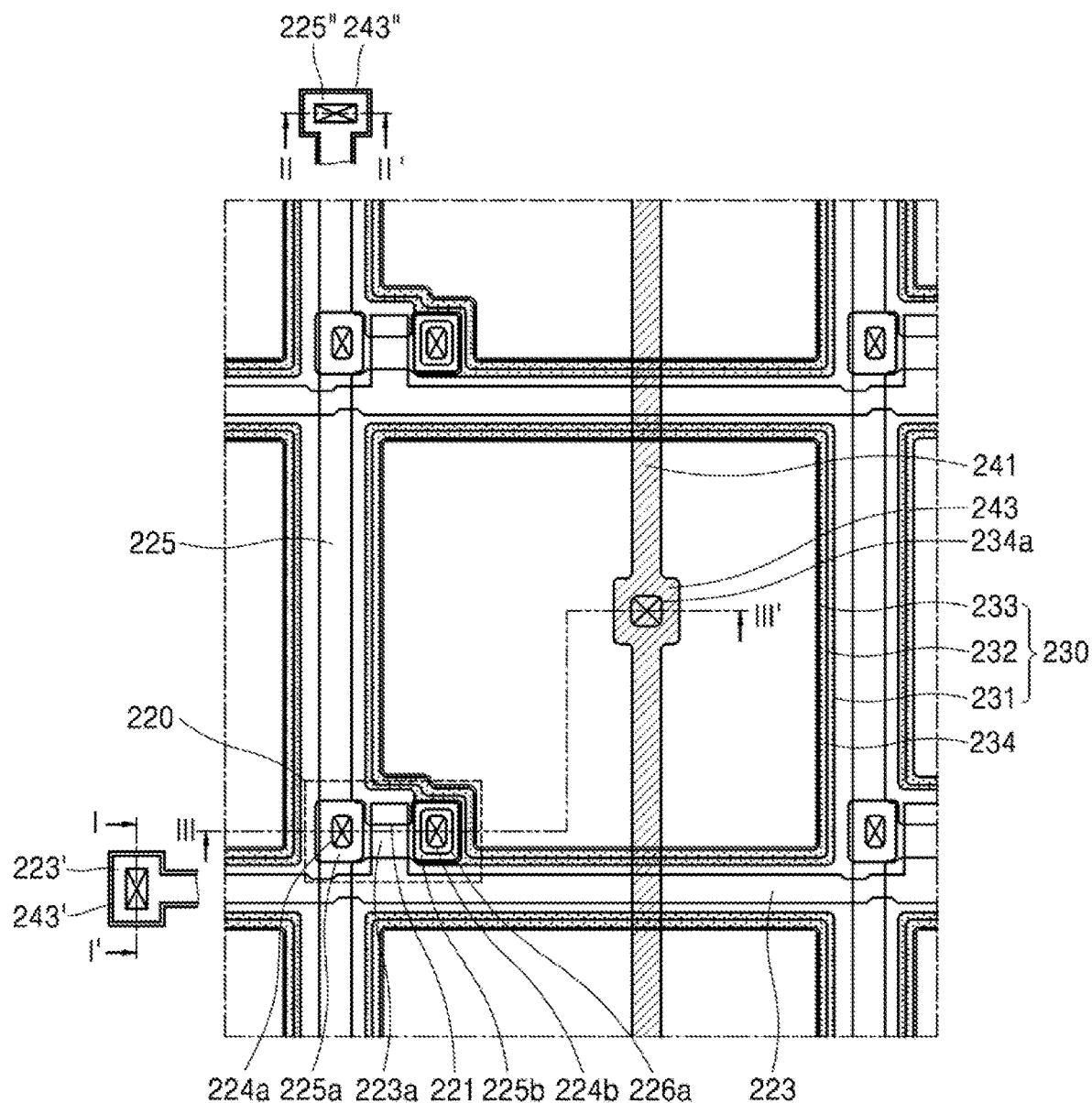
FIG. 5 is a top view of a partial region of a thin-film transistor array substrate for a digital X-ray detector according to a second embodiment of the present disclosure.

In a second embodiment, the second protective layer 234 may be patterned to cover the edge region of the PIN diode 230, as shown in FIG. 5. Specifically, the second protective layer 234 may be formed along the edge region of the PIN diode 230 to cover the side surface of the PIN diode 230, that is, a side surface of the PIN layer 232 which is most vulnerable to external moisture.

When the second protective layer 234 may be formed along the edge region of the PIN diode 230, the second protective layer 234 may have a form of a closed curve having a hollow portion therein. The second protective layer 234 may be formed along the side surface of the PIN diode 230. In this case, the upper electrode 233 of the PIN diode 230 present on the top surface of the PIN diode 230 where the second protective layer 234 is not formed may serve as the moisture barrier film.

It is desirable in the PIN diode 230 that the top surface of the PIN diode 230 is not covered as much as possible with a layer other than the upper electrode 233, so that the fill factor thereof is increased as much as possible. Therefore, when the entire top surface of the PIN diode 230 is not covered with the second protective layer 234, and only the edge region of the PIN diode is covered with the second protective layer 234, both the moisture barrier effect for and the fill factor improvement effect of the PIN diode 230 may be achieved.

However, this configuration may not be limited to a configuration that the second protective layer 234 is not formed on the top surface of the PIN diode 230 at all. However, the second protective layer 234 may be partially formed on a portion of the top surface belonging to the edge region of the PIN diode 230. Specifically, the second protective layer 234 may be formed to cover a portion of the top surface of the PIN diode 230 that is not covered by the upper electrode 233.

The second protective layer 234 according to the second embodiment may be patterned so as to cover each of the plurality of PIN diodes 230 so that the second protective layer 234 covering a corresponding PIN diode 230 may not be connected to a second protective layer 234 covering a PIN diode 230 adjacent to the corresponding PIN diode 230.

That is, the second protective layer 234 may be formed to be conformal to the PIN diode 230 so as not to cover the thin-film transistor 220 and not to cover the gate line 223 and the data line 225.

Thus, the second protective layer 234 may be formed along the edge region of the PIN diode 230 to effectively protect the PIN diode 230 from external moisture.

The second protective layer 234 is formed so as not to cover the thin-film transistor 220, specifically, the active layer 221. Thus, a path along which hydrogen from the active layer 221 is discharged out may be secured. Thus, the deterioration of the electrical characteristics of the thin-film transistor element may be reduced or minimized.

Figure 6:
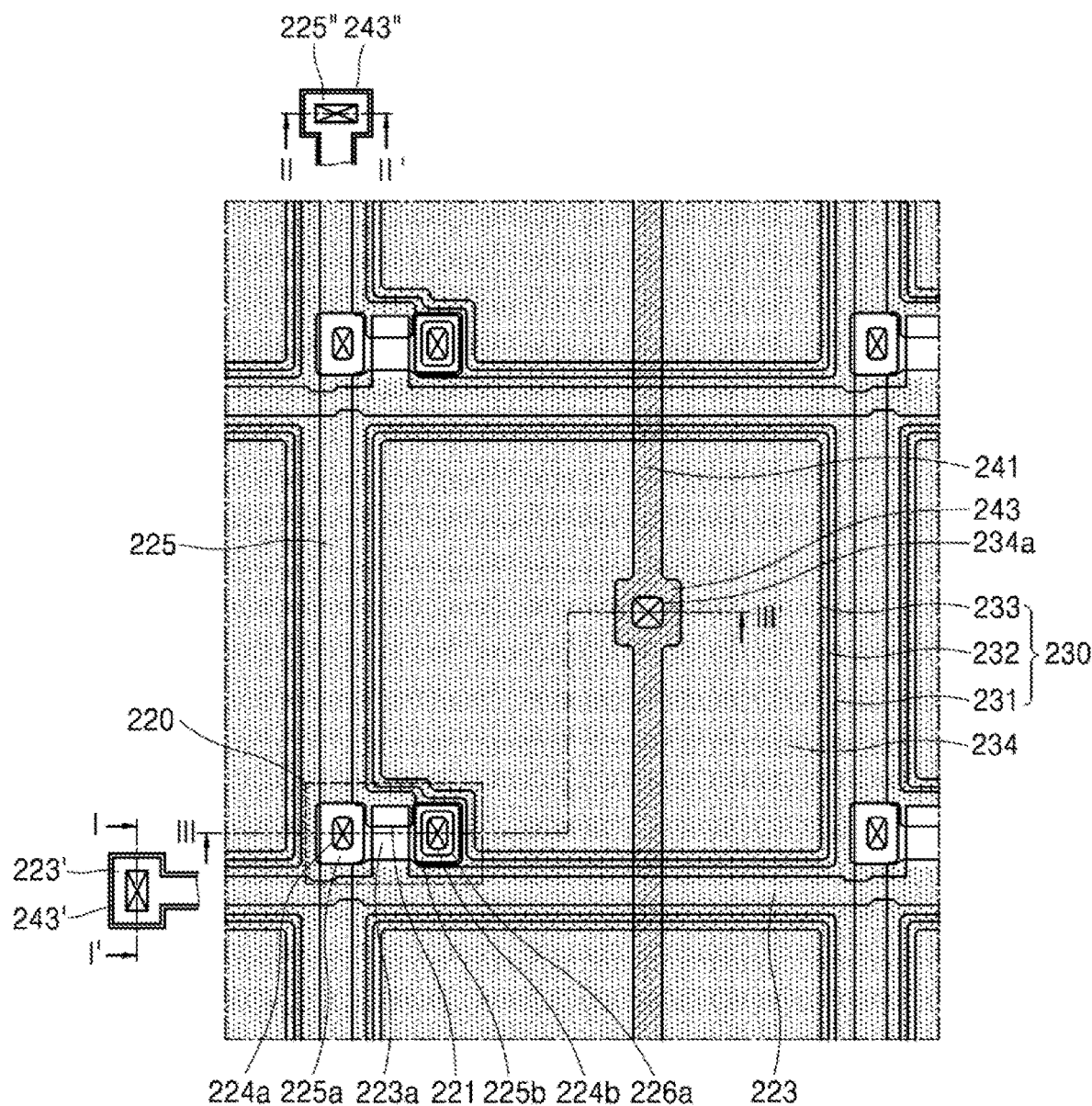
FIG. 6 is a top view of a partial region of a thin-film transistor array substrate for a digital X-ray detector according to a third embodiment of the present disclosure.

In a third embodiment, the second protective layer 234 may be patterned to cover an entire surface of the base substrate 210 except for a region of the base substrate at which the thin-film transistor 220 is disposed as shown in FIG. 6.

In the third embodiment, the second protective layer 234 may be formed to cover the side surface and the top surface of the PIN diode 230 such that the second protective layer 234 acts as a moisture barrier film that reduces or minimizes the penetration of external moisture into the PIN diode 230.

Further, according to the third embodiment, the second protective layer 234 may be formed to connect all of the plurality of PIN diodes 230 to each other to cover the entire surface of the base substrate 210 but may be formed so as not to cover the thin-film transistor 220.

Thus, since the second protective layer 234 is formed to cover not only the plurality of PIN diodes 230 but also the entire surface of the based substrate 210 including the gate line 223 and the data line 225, the covering region of the second protective layer 234 is further enlarged. Thus, it is possible to more effectively reduce or minimize the penetration of external moisture into the elements under the second protective layer 234.

Since the second protective layer 234 is patterned so as not to cover the thin-film transistor 220, specifically, the active layer 221, a path through which the hydrogen from the active layer 221 is discharged out may be secured. Thus, the deterioration of the electrical characteristics of the thin-film transistor element may be reduced or minimized.

Figure 7:
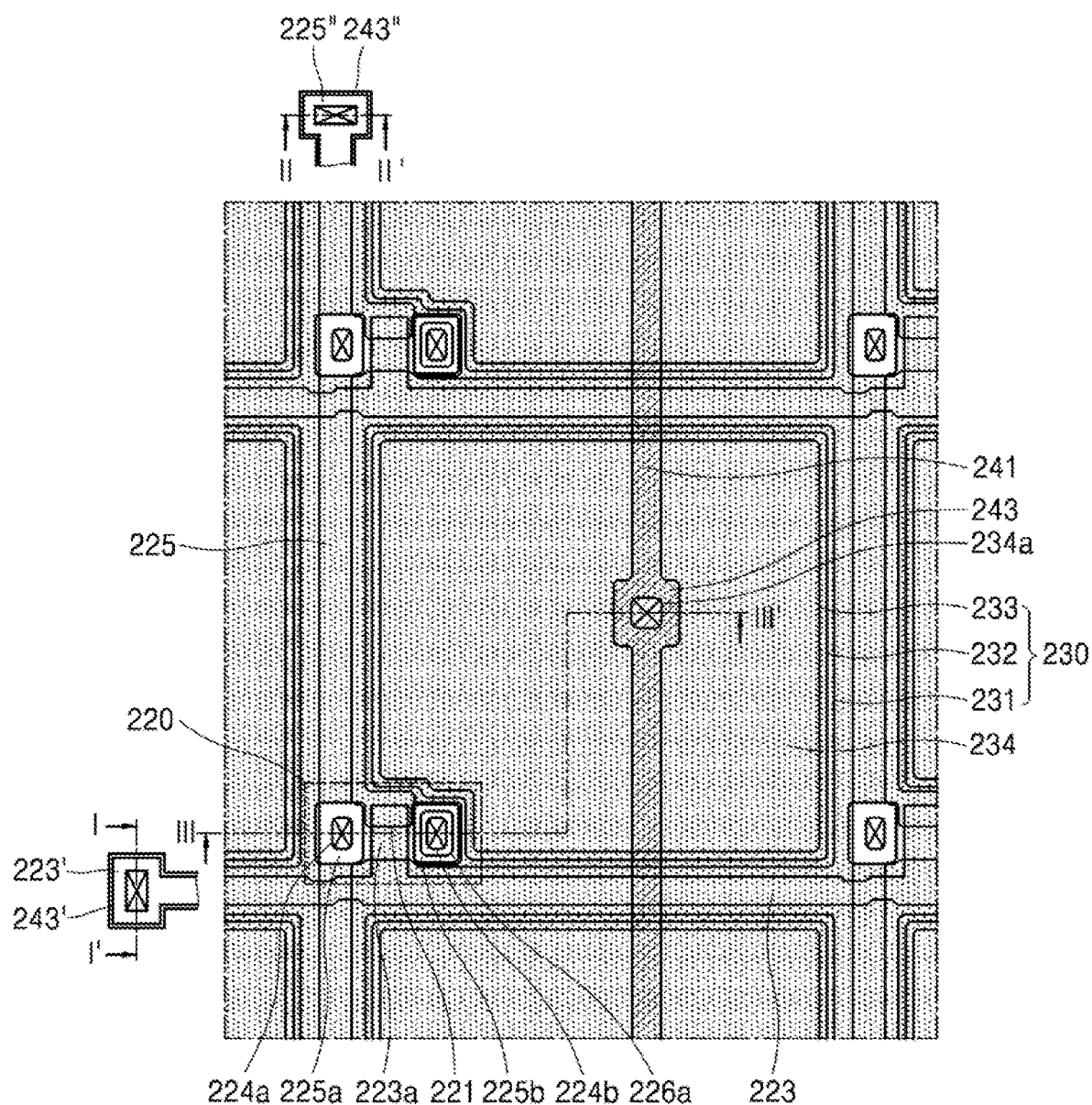
FIG. 7 is a top view of a partial region of a thin-film transistor array substrate for a digital X-ray detector according to a fourth embodiment of the present disclosure.

In a fourth embodiment, the second protective layer 234 may be patterned to further cover the gate electrode 223a of the thin-film transistor 220 as shown in FIG. 7. That is, the second protective layer 234 according to the fourth embodiment may be formed so that only a partial region of the thin-film transistor 220 overlaps with the second protective layer 234.

This pattern of the fourth embodiment may include a construction that the second protective layer 234 covers the entire surface of the PIN diode 230 and/or a construction that the second protective layer 234 covers the edge region of the PIN diode 230. The fourth embodiment will be described based on an example in which, as in the third embodiment, the second protective layer 234 connects the plurality of PIN diodes 230 to each other and covers the plurality of PIN diodes 230.

That is, the fourth embodiment is different from the third embodiment in that the second protective layer 234 is additionally formed to cover the partial region of the thin-film transistor 220, that is, the gate electrode 223a thereof.

When the second protective layer 234 covers the gate electrode 223a of the thin-film transistor 220 as in the fourth embodiment, the covering region of the second protective layer 234 expands. This may more effectively reduce or minimize the penetration of external moisture into the elements below the second protective layer 234.

Although the second protective layer 234 is further formed to cover the gate electrode 223a of the thin-film transistor 220, the first contact hole 224a and the second contact hole 224b of the inter-layer insulating layer 224 are not covered with the second protective layer 234.

Therefore, the hydrogen may be discharged from the active layer 221 of the thin-film transistor 220 through the first contact hole 224a and the second contact hole 224b to the outside. Thus, the deterioration of the electrical characteristic of the thin-film transistor element may be reduced or minimized.

Figure 8:
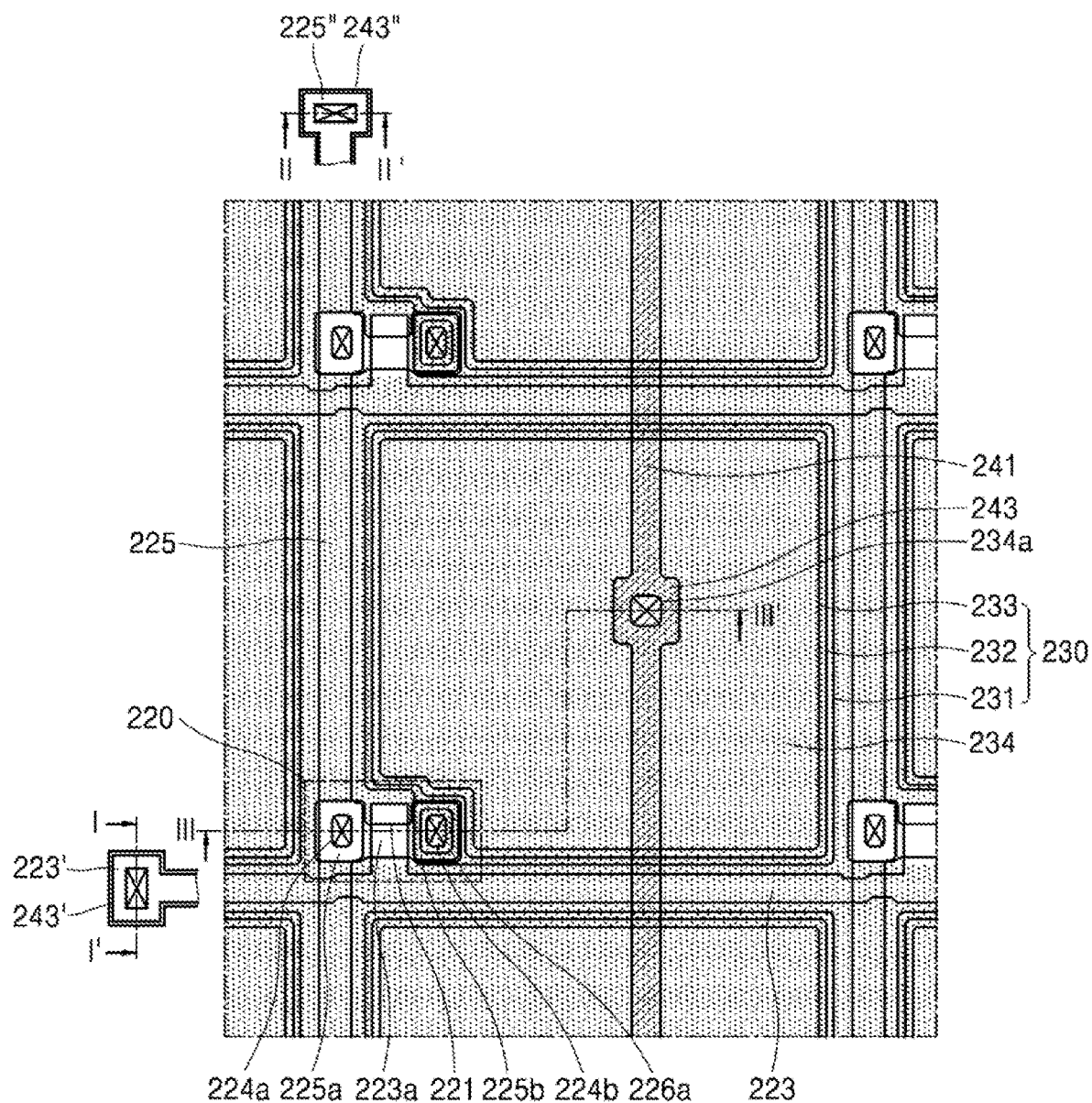
FIG. 8 is a top view of a partial region of a thin-film transistor array substrate for a digital X-ray detector according to a fifth embodiment of the present disclosure.

In a fifth embodiment, the second protective layer 234 may be patterned to further cover one of the first contact hole 224a and the second contact hole 224b of the thin-film transistor 220 as shown in FIG. 8.

The second protective layer 234 according to the fifth embodiment may be patterned such that the second protective layer 234 overlaps only with a partial region of the thin-film transistor 220 as in the fourth embodiment.

This pattern of the fifth embodiment may include a construction that the second protective layer 234 covers the entire surface of the PIN diode 230 and/or a construction that the second protective layer 234 covers the edge region of the PIN diode 230. The fifth embodiment will be described based on an example in which, as in the fourth embodiment, the second protective layer 234 connects the plurality of PIN diodes 230 to each other and covers the plurality of PIN diodes 230.

That is, the fifth embodiment is different from the fourth embodiment in that the second protective layer 234 is formed to additionally cover one of the first contact hole 224a and the second contact hole 224b of the thin-film transistor 220. In FIG. 8, an example where the second protective layer 234 covers the second contact hole 224b is shown.

When, as in the fifth embodiment, the second protective layer 234 covers the gate electrode 223a and the second contact hole 224b of the thin-film transistor 220, the covering region of the second protective layer 234 is further enlarged. Thus, it is possible to more effectively reduce or minimize the penetration of external moisture into the elements under the second protective layer 234.

Although the second protective layer 234 is formed to cover the gate electrode 223a of the thin-film transistor 220, the first contact hole 224a of the inter-layer insulating layer 224 is not covered with the second protective layer 234.

Therefore, the hydrogen may be discharged from the active layer 221 of the thin-film transistor 220 through the first contact hole 224a to the outside. Thus, deterioration of the electrical characteristic of the thin-film transistor element may be reduced or minimized.

In accordance with the present disclosure, the second protective layer 234 made of an inorganic material such as silicon nitride $SiN_x$ having a hydrogen diffusion distance of about $9.9 \times 10^{-3}$ nm or smaller at about 105° C. for about one second may have the various patterns with the various embodiments as described above to reduce or minimize aging of the PIN diode due to the external moisture.

Further, according to the present disclosure, the dehydrogenation path from the thin-film transistor 220 made of the oxide semiconductor can be secured. Thus, the negative shift phenomenon of the thin-film transistor 220 may be improved to reduce or minimize the deterioration of the electrical characteristics of the thin-film transistor 220 and to increase the uniformity of the electrical characteristics.

Particularly, according to the present disclosure, even when the thickness of the moisture barrier film for the PIN diode 230 is increased or maximized, this does not hinder the formation of the dehydrogenation path. Thus, the PIN diode 230 can be protected by the protective layer as thick as possible, further reducing or minimizing the aging of the PIN diode 230 due to external moisture, thereby further improving the reliability of the PIN diode.

Compared with the second protective layer 234, each of the first protective layer 226 and the inter-layer insulating layer 224 may be made of an inorganic material such as $SiO_2$ or SiON having a hydrogen diffusion distance of about $9.9 \times 10^{-3}$ nm or larger at about 105° C. for about one second.

The first protective layer 226 and the inter-layer insulating layer 224 may be formed under the PIN diode 230. The second protective layer 234 allows the PIN diode 230 to be shielded from moisture. Thus, each of the first protective layer 226 and the inter-layer insulating layer 224 may be made of the inorganic material such as $SiO_2$ or SiON rather than $SiN_x$.

Further, each of the first protective layer 226 and inter-layer insulating layer 224 may be made of an inorganic material such as $SiN_x$ having a hydrogen diffusion distance of about $9.9 \times 10^{-3}$ nm or smaller at about 105° C. for about 1 second.

In this case, although the inter-layer insulating layer 224 is formed on a top face of the active layer 221, hydrogen can be discharged from the active layer 221 through the first contact hole 224a and the second contact hole 224b of the inter-layer insulating layer 224 to the outside. Thus, even when the inter-layer insulating layer 224 is made of $SiN_x$, the dehydrogenation effect may still be obtained.

Further, although the first protective layer 226 is formed on a top of the active layer 221 of the thin-film transistor 220, the dehydrogenation path from the active layer through the second contact hole 224b of the inter-layer insulating layer 224 and the third contact hole 226a of the first protective layer 226 to the outside may be secured. Thus, even when the first protective layer 226 is made of $SiN_x$, the dehydrogenation effect may still be obtained.

That is, when the dehydrogenation path from the active layer through at least one of the first contact hole 224a and the second contact hole 224b to the outside may be secured, the dehydrogenation effect may still be obtained even when each of the first protective layer 226 and the inter-layer insulating layer 224 is made of an inorganic material such as $SiN_x$ having a hydrogen diffusion distance of about $9.9 \times 10^{-3}$ nm or smaller at about 105° C. for about 1 second.

A bias electrode 243 may be formed on the second protective layer 234 on the PIN diode 230. The bias electrode 243 may be connected to the upper electrode 233 of the PIN diode 230 via a fourth contact hole 234a formed in the second protective layer 234 to apply a bias voltage to the PIN diode 230.

A third protective layer 245 may be formed on the bias electrode 243 to cover the entire surface of the base substrate 210. In this case, the third protective layer 245 may be in direct contact with both the first protective layer 226 and the second protective layer 234.

Specifically, the third protective layer 245 may be formed to cover the PIN diode 230 and the thin-film transistor 220. The third protective layer 245 may be made of an inorganic substance such as $SiO_2$ or SiON having a hydrogen diffusion distance of about $9.9 \times 10^{-3}$ nm or larger at about 105° C. for about 1 second.

Since the third protective layer 245 is formed to cover both the PIN diode 230 and the thin-film transistor 220, it may be difficult to secure the separate hydrogen escape or discharge route. Therefore, the third protective layer 245 may not be made of an inorganic material such as SiNx, but may be made of an inorganic substance such as $SiO_2$ or SiON having a hydrogen diffusion distance of about $9.9 \times 10^{-3}$ nm or larger at about 105° C. for about 1 second.

The second protective layer 234 formed to surround the side surface of the PIN diode 230 and the third protective layer 245 formed on the second protective layer 234 may be made of inorganic materials having different hydrogen diffusion distances respectively.

In one embodiment, the second protective layer 234 formed to surround the side surface of the PIN diode 230 and the third protective layer 245 formed on the second protective layer 234 may be made of inorganic materials having different refractive indexes respectively.

For example, when the second protective layer 234 is formed of $SiN_x$, and the third protective layer 245 is formed of $SiO_2$ or SiON, the second protective layer 234 has a lower refractive index than that of the third protective layer 245, while the third protective layer 245 has a higher refractive index than that of the second protective layer 234.

That is, the second protective layer 234 acts as a low refractive index layer, while the third protective layer 245 on the second protective layer 234 acts as a high refractive index layer. Thus, due to the difference in refractive index therebetween, light emitted to the side surface of the PIN diode 230 is scattered outwardly of the side surface thereof, so that direct irradiation of light to the side surface of the PIN diode 230 may be reduced or minimized.

When the PIN diode 230 is irradiated with light, it is normal that the light is input through the top surface of the PIN diode 230 and passes through the PIN layer 232, such that the light is converted into an electronic signal. However, a portion of light may be incident on the side surface direction of the PIN diode 230.

Therefore, in accordance with the present disclosure, when the protective layers having different refractive indexes are formed on the side surface of the PIN diode 230, this may reduce or minimize influence of light irradiated to the side surface of the PIN diode 230 rather than the top surface thereof. As a result, the stability of the PIN diode 230 may be improved and the malfunction of the PIN diode 230 may be reduced or minimized, thereby improving the reliability of the PIN diode.

Figure 4:
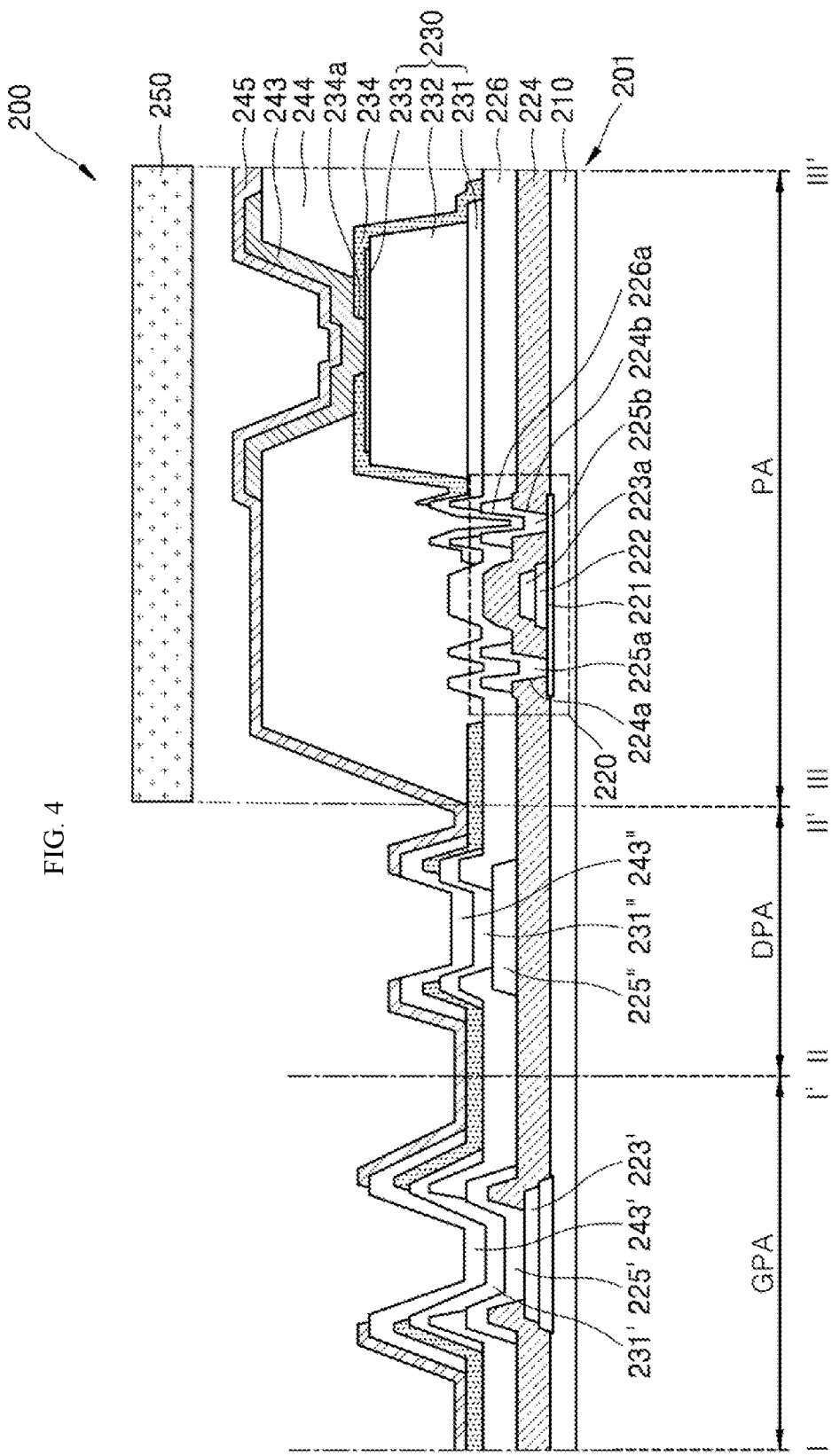
FIG. 4 is a cross-sectional view of a partial region of a thin-film transistor array substrate for a digital X-ray detector according to a variation of the first embodiment of the present disclosure.

Further, a planarization layer 244 may be formed between the second protective layer 234 and the third protective layer 245 as shown in FIG. 4. The planarization layer 244 may have a planarized top face regardless of a shape of the underlying electrode or elements, thereby to reduce or minimize a curved portion. The planarization layer 244 may be made of an organic material such as an acrylic resin such as photo acryl (PAC). However, the present disclosure is not limited thereto. A material such as PR (photo resist) may be used for the planarization layer 244.

In this case, the planarization layer 244 may directly contact the first protective layer 226 and the second protective layer 234 as well as directly contact the third protective layer 245.

The gate pad area GPA and data pad area DPA will be described with reference to FIG. 2 and FIG. 3.

The gate pad area GPA may be formed such that a gate pad 223', a first gate connection pad 225', a second gate connection pad 231', and a gate contact pad 243' are stacked.

The gate pad 223' may be formed in the same process as the gate electrode 223a. The first gate connection pad 225' may be formed in the same process as the first electrode 225a and the second electrode 225b. The second gate connection pad 231' may be formed in the same process as the lower electrode 231. The gate contact pad 243' may be formed in the same process as the upper electrode 233.

The second protective layer 234 may be formed in the gate pad area. The second protective layer 234 may be formed between the first gate connection pad 225' and the second gate connection pad 231'.

In this case, the second protective layer 234 may be formed to have an opening region in a contact hole region in which the gate connection pads 225' and 231' are connected to each other.

Further, the third protective layer 245 may be formed on the gate contact pad 243'. The third protective layer 245 may be formed to have an opening region in a contact hole region in which the gate contact pad 243' is connected to the second gate connection pad 231'.

The data pad area DPA may be formed such that a data pad 225", a data connection pad 231" and a data contact pad 243" are stacked.

The data pad 225" may be formed in the same process as the first electrode 225a and second electrode 225b. The data connection pad 231" may be formed in the same process as the lower electrode 231. The data contact pad 243" may be formed in the same process as the upper electrode 233.

Further, in the data pad area, the second protective layer 234 may be formed. The second protective layer 234 may be formed between the data connection pad 231" and the data contact pad 243".

In this case, the second protective layer 234 may be formed to have an opening region in a contact hole region in which the data connection pad 231" and the data contact pad 243" are connected to each other.

Further, the third protective layer 245 may be formed on the data contact pad 243". The third protective layer 245 may be formed to have an opening region in a contact hole region in which the data connection pad 231" and the data contact pad 243" are connected to each other.

On the array substrate 201 according to the present disclosure, a scintillator layer 250 may be formed to cover the PIN diode 230. Since the scintillator layer 250 may be deposited directly on the array substrate 201, planarization of a top surface of the array substrate 201 is required. Thus, the planarization layer 244 may be formed to planarize the top surface of the array substrate 201. This may facilitate the formation of the scintillator layer 250 via deposition of the scintillator material.

The digital X-ray detector 200 according to the present disclosure operates as follows.

The X-ray irradiated to the digital X-ray detector 200 is converted to light of the visible-light region by the scintillator layer 250. The light of the visible-light region is converted to an electronic signal by the PIN layer 232 of the PIN diode 230.

Specifically, when light of the visible-light region is irradiated to the PIN layer 232, a I-type semiconductor layer is depleted by a P-type semiconductor layer and a N-type semiconductor layer, such that an electric field is generated therein. Then, holes and electrons generated by the light are drifted by the electric field and are collected into the P type semiconductor layer and the N type semiconductor layer, respectively.

The PIN diode 230 converts the light of the visible-light region into the electronic signal and transmits the signal to the thin-film transistor 220. The transmitted electronic signal passes along the data line 225 connected to the thin-film transistor 220 and then is displayed as a video signal.

The present disclosure is described with reference to the drawings and embodiments. However, the present disclosure is not limited to the embodiments and drawings disclosed herein. It will be apparent that various modifications may be made thereto by those skilled in the art within the scope of the present disclosure. Furthermore, although the effects resulting from the configurations of the present disclosure have not been explicitly in describing the effect resulting from the configurations of the present disclosure, the effects expected from the configurations of the present disclosure should be recognized.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin-film transistor array substrate for a digital X-ray detector, comprising:
   a base substrate;
   a thin-film transistor disposed on the base substrate, wherein the thin-film transistor includes an active layer, a gate electrode, and a first electrode and a second electrode connected to the active layer;
   a first protective layer disposed on the thin-film transistor;

a PIN diode disposed on the first protective layer, wherein the PIN diode includes a lower electrode connected to the thin-film transistor, a PIN layer on the lower electrode, and an upper electrode on the PIN layer;

a second protective layer covering at least a portion of the PIN diode, wherein the thin-film transistor is not covered with the second protective layer;

a bias electrode disposed on the PIN diode and connected to the upper electrode; and a third protective layer disposed on the bias electrode, wherein the third protective layer covers the thin-film transistor and the PIN diode, wherein the second protective layer covers and surrounds the side surfaces of the PIN diode and is in direct contact with the side surfaces of the PIN diode, and the third protective layer covers the side surfaces of the PIN diode and is in direct contact with the second protective layer surrounding the side surfaces of the PIN diode.

2. The thin-film transistor array substrate of claim 1, wherein the second protective layer and the third protective layer is made of inorganic materials having different refractive indexes.

3. The thin-film transistor array substrate of claim 2, wherein the third protective layer has a higher refractive index than the second protective layer.

4. The thin-film transistor array substrate of claim 1, wherein the third protective layer is in direct contact with both the first protective layer and the second protective layer.

5. The thin-film transistor array substrate of claim 1, wherein the second protective layer covers a top surface and side surfaces of the PIN diode.

6. The thin-film transistor array substrate of claim 1, wherein the second protective layer covers an edge region of the PIN diode.

7. The thin-film transistor array substrate of claim 1, wherein the second protective layer is on the base substrate except for a region of the base substrate at which the thin-film transistor is disposed.

8. The thin-film transistor array substrate of claim 1, wherein the second protective layer includes $SiN_x$.

9. The thin-film transistor array substrate of claim 1, wherein the thin-film transistor array substrate further comprises an inter-layer insulating layer disposed between the active layer and, the first electrode and the second electrode, wherein the active layer is connected to the first electrode and the second electrode via a first contact hole and a second contact hole formed in the inter-layer insulating layer, respectively.

10. The thin-film transistor array substrate of claim 9, wherein each of the first protective layer, the inter-layer insulating layer and the third protective layer includes at least one of $SiO_2$ or SiON.

11. The thin-film transistor array substrate of claim 9, wherein the first protective layer includes $SiN_x$, wherein at least one of the first contact hole or the second contact hole is not covered with $SiN_x$.

12. A digital X-ray detector, comprising:
a thin-film transistor array substrate, the thin-film transistor array substrate including:
a base substrate;
a plurality of thin-film transistors on the base substrate, wherein each thin-film transistor include an active layer, a gate electrode, a first electrode, and a second electrode, the first and second electrodes connected to the active layer;
a first protective layer on the plurality of thin-film transistors;
a PIN diode on the first protective layer, wherein the PIN diode includes a lower electrode connected to the thin-film transistor, a PIN layer on the lower electrode, and an upper electrode on the PIN layer;
a second protective layer on a portion of the PIN diode, the second protective layer exposing a space of the PIN diode;
a bias electrode on the PIN diode and connected to the upper electrode; and
a third protective layer on the bias electrode, wherein the third protective layer extends over the thin-film transistor and the PIN diode; and
a scintillator layer disposed on the thin-film transistor array substrate,
wherein the second protective layer covers and surrounds side surfaces of the PIN diode and is in direct contact with the side surfaces of the PIN diode, and the third protective layer covers the side surfaces of the PIN diode and is in direct contact with the second protective layer surrounding the side surfaces of the PIN diode.

13. The digital X-ray detector of claim 12, wherein the second protective layer is spaced apart from the thin-film transistor.

14. The digital X-ray detector of claim 12, wherein the bias electrode covers the space exposed by the second protective layer.

15. The digital X-ray detector of claim 12, wherein the second protective layer and the third protective layer is made of inorganic materials having different refractive indexes.

16. The digital X-ray detector of claim 15, wherein the third protective layer has a higher refractive index than the second protective layer.

\* \* \* \* \*